US012560863B2

(12) United States Patent
Suda et al.

(10) Patent No.: US 12,560,863 B2
(45) Date of Patent: Feb. 24, 2026

(54) ETCHING METHOD AND PLASMA PROCESSING SYSTEM

(71) Applicant: Tokyo Electron Limited, Tokyo (JP)

(72) Inventors: Ryutaro Suda, Miyagi (JP); Maju Tomura, Miyagi (JP); Yoshihide Kihara, Miyagi (JP); Taiki Miura, Miyagi (JP); Jaeyoung Park, Gyeonggi-do (KR); Yusuke Fukunaga, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 330 days.

(21) Appl. No.: 18/121,700

(22) Filed: Mar. 15, 2023

(65) Prior Publication Data

US 2023/0251567 A1 Aug. 10, 2023

Related U.S. Application Data

(63) Continuation-in-part of application No. PCT/JP2022/016596, filed on Mar. 31, 2022.

(Continued)

(51) Int. Cl.
*G03F 1/80* (2012.01)
*G03F 7/075* (2006.01)
*H01J 37/32* (2006.01)

(52) U.S. Cl.
CPC .............. *G03F 1/80* (2013.01); *G03F 7/075* (2013.01); *H01J 37/32449* (2013.01);
(Continued)

(58) Field of Classification Search
CPC ...... G03F 1/80; G03F 7/075; H01J 37/32449; H01J 37/32458; H01J 37/32715;
(Continued)

(56) References Cited

U.S. PATENT DOCUMENTS

2018/0286695 A1* 10/2018 Sako ................. H01L 21/67017
2020/0105539 A1* 4/2020 Takahashi ......... H01L 21/67161

FOREIGN PATENT DOCUMENTS

JP 05-267242 A 10/1993
JP 2001-007080 A 1/2001
(Continued)

OTHER PUBLICATIONS

International Search Report and Written Opinion mailed on Jun. 21, 2022, received for PCT Application PCT/JP2022/016596, filed on Mar. 31, 2022, 14 pages including English Translation.

*Primary Examiner* — Duy Vu N Deo
(74) *Attorney, Agent, or Firm* — XSENSUS LLP

(57) ABSTRACT

An etching method comprises (a) providing a substrate in a chamber, the substrate including a silicon-containing film and a mask on the silicon-containing film; and (b) etching the silicon-containing film, including (b-1) etching the silicon-containing film using plasma generated from a first process gas, the first process gas containing a hydrogen fluoride gas and a reaction control gas to control a reaction between hydrogen fluoride and the silicon-containing film, the first process gas containing, as the reaction control gas, at least one of a reaction accelerator gas to accelerate the reaction or a reaction inhibitor gas to inhibit the reaction, and (b-2) etching the silicon-containing film using plasma generated from a second process gas, the second process gas containing a hydrogen fluoride gas, and containing at least one of a reaction accelerator gas to accelerate the reaction or a reaction inhibitor gas to inhibit the reaction.

20 Claims, 11 Drawing Sheets

Related U.S. Application Data

(60) Provisional application No. 63/172,316, filed on Apr. 8, 2021.

(52) U.S. Cl.
CPC .. *H01J 37/32458* (2013.01); *H01J 37/32715* (2013.01); *H01J 37/32798* (2013.01); *H01J 2237/334* (2013.01)

(58) Field of Classification Search
CPC ........... H01J 37/32798; H01J 2237/334; H01J 37/32091; H01J 37/32165; H01J 37/32137; H01L 21/31116; H01L 21/32137; H01L 21/3065; H01L 21/31144; H01L 21/32139; H01L 21/67069
USPC .......................................................... 216/67
See application file for complete search history.

(56) References Cited

FOREIGN PATENT DOCUMENTS

| | | | |
|---|---|---|---|
| JP | 2003-347260 | A | 12/2003 |
| JP | 2010-003725 | A | 1/2010 |
| JP | 2016-015382 | A | 1/2016 |
| JP | 2016-213427 | A | 12/2016 |
| JP | 2017-208387 | A | 11/2017 |
| JP | 2018006405 | A * | 1/2018 |
| JP | 2018-166147 | A | 10/2018 |
| JP | 2018-170380 | A | 11/2018 |
| WO | 2021/090798 | A1 | 5/2021 |

* cited by examiner

ETCHING METHOD AND PLASMA PROCESSING SYSTEM

CROSS-REFERENCE TO RELATED APPLICATIONS

The present application is a bypass continuation-in-part application of International Application No. PCT/JP2022/016596, filed Mar. 31, 2022, which contains subject matter related to, and claims the benefit of the earlier filing date to, U.S. provisional application 63/172,316, filed Apr. 8, 2021, the entire contents of each of which being incorporated herein by reference. This application is also related to U.S. Ser. No. 17/666,570, entitled: ETCHING METHOD, filed on Feb. 8, 2022 and U.S. Ser. No. 17/092,376, entitled: SUBSTRATE PROCESSING METHOD AND SUBSTRATE PROCESSING APPARATUS, filed on Nov. 9, 2020, the entire contents of which are incorporated herein by reference.

FIELD

Exemplary embodiments of the present disclosure relate to an etching method and a plasma processing system.

BACKGROUND

A technique for etching a silicon-containing film included in a substrate using a mask containing amorphous carbon or organic polymers is described in Patent Literature 1.

CITATION LIST

Patent Literature

Patent Literature 1: Japanese Unexamined Patent Application Publication No. 2016-39310

BRIEF SUMMARY

Technical Problem

One or more aspects of the present disclosure are directed to a technique for reducing feature failures in etching.

Solution to Problem

An etching method according to one exemplary embodiment of the present disclosure is implementable with a plasma processing apparatus including a chamber. The method includes (a) placing a substrate including a silicon-containing film and a mask on the silicon-containing film on a substrate support located in the chamber, and (b) etching the silicon-containing film. Step (b) includes (b-1) etching the silicon-containing film using plasma generated from a first process gas, and (b-2) etching the silicon-containing film using plasma generated from a second process gas. The first process gas contains a hydrogen fluoride gas and a reaction control gas to control a reaction between hydrogen fluoride and the silicon-containing film. The first process gas contains, as the reaction control gas, at least one of a reaction accelerator gas to accelerate the reaction or a reaction inhibitor gas to inhibit the reaction. The second process gas contains a hydrogen fluoride gas. The second process gas contains at least one of a reaction accelerator gas to accelerate the reaction or a reaction inhibitor gas to inhibit the reaction, or contains no reaction control gas. The reaction accelerator gas contained in the second process gas has a lower partial pressure than the reaction accelerator gas contained in the first process gas. The reaction inhibitor gas contained in the second process gas has a higher partial pressure than the reaction inhibitor gas contained in the first process gas.

Advantageous Effects

The technique according to one exemplary embodiment of the present disclosure reduces feature failures in etching.

DETAILED DESCRIPTION

Figure 1:
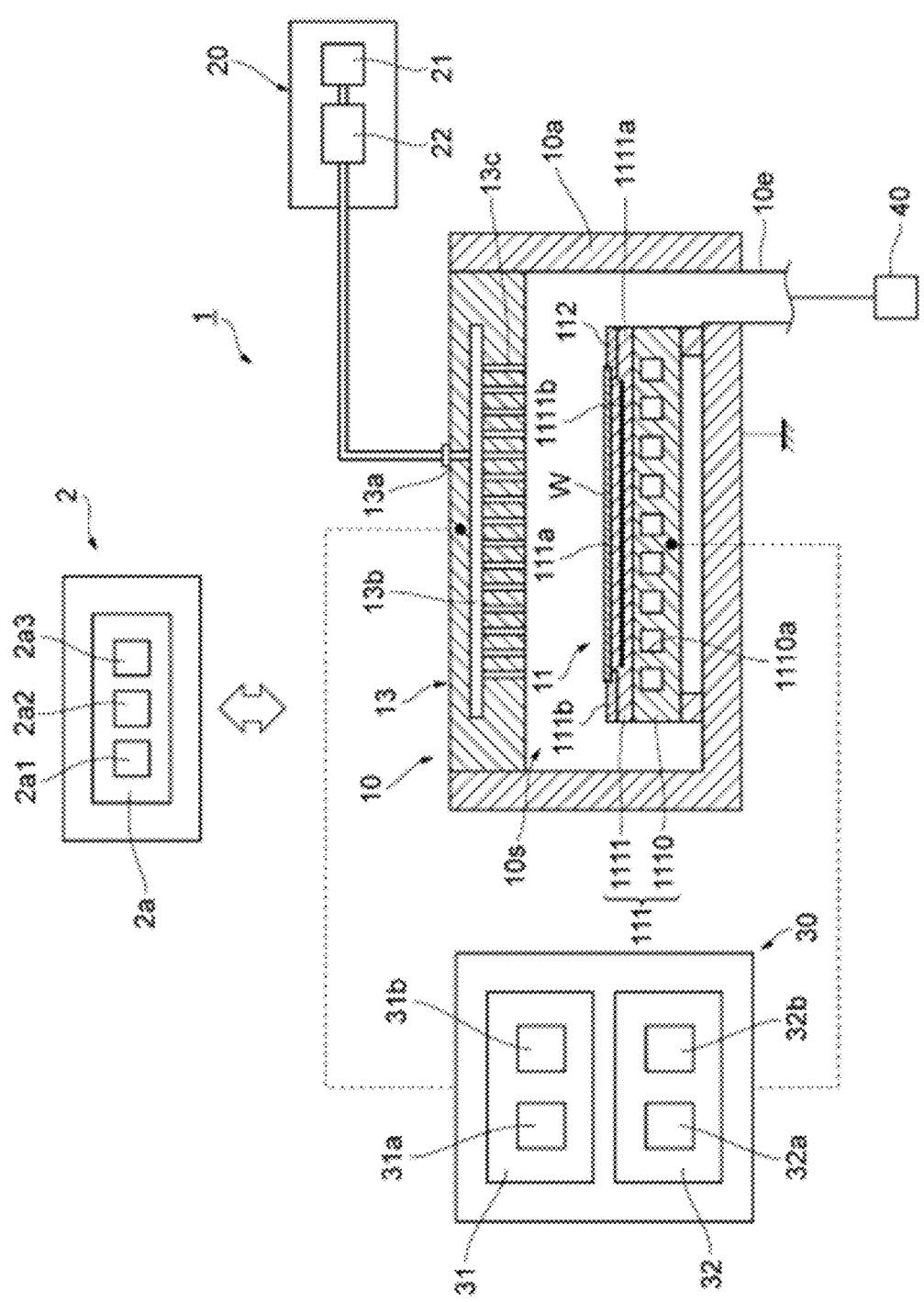
FIG. 1 is a schematic diagram of an exemplary plasma processing system.

One or more embodiments of the present disclosure will be described below.

An etching method according to one exemplary embodiment of the present disclosure is implementable with a plasma processing apparatus including a chamber. The method includes (a) placing a substrate including a silicon-containing film and a mask on the silicon-containing film on a substrate support located in the chamber, and (b) etching the silicon-containing film. Step (b) includes (b-1) etching the silicon-containing film using plasma generated from a first process gas, and (b-2) etching the silicon-containing film using plasma generated from a second process gas. The first process gas contains a hydrogen fluoride gas and a reaction control gas to control a reaction between hydrogen fluoride and the silicon-containing film. The first process gas contains, as the reaction control gas, at least one of a reaction accelerator gas to accelerate the reaction or a reaction inhibitor gas to inhibit the reaction. The second process gas contains a hydrogen fluoride gas. The second process gas contains at least one of a reaction accelerator gas to accelerate the reaction or a reaction inhibitor gas to inhibit the reaction, or contains no reaction control gas. The reaction accelerator gas contained in the second process gas has a lower partial pressure than the reaction accelerator gas contained in the first process gas. The reaction inhibitor gas contained in the second process gas has a higher partial pressure than the reaction inhibitor gas contained in the first process gas.

In one exemplary embodiment, (b) includes (b-2) performed after (b-1).

In one exemplary embodiment, (b) includes (b-1) performed after (b-2).

In one exemplary embodiment, (b) includes (b-1) and (b-2) repeated alternately.

In one exemplary embodiment, (b) includes switching between (b-1) and (b-2) based on at least one of a depth of a recess to be formed in the silicon-containing film by etching, an aspect ratio of the recess, or an etching time of the etching.

In one exemplary embodiment, (b-1) includes generating the plasma from the first process gas using a pulsed wave of a source radio-frequency signal having a first duty ratio, and (b-2) includes generating the plasma from the second process gas using a pulsed wave of a source radio-frequency signal having a second duty ratio lower than the first duty ratio.

In one exemplary embodiment, the reaction accelerator gas is at least one selected from the group consisting of a phosphorus-containing gas, a nitrogen-containing gas, and a hydrogen-containing gas.

In one exemplary embodiment, the phosphorous-containing gas is a phosphorus halide gas.

In one exemplary embodiment, the nitrogen-containing gas is at least one selected from the group consisting of an $NH_3$ gas, an $NF_3$ gas, an NO gas, and an $NO_2$ gas.

In one exemplary embodiment, the hydrogen-containing gas is a gas having a hydroxyl group.

In one exemplary embodiment, the reaction inhibitor gas is a chlorine-containing gas.

In one exemplary embodiment, the chlorine-containing gas is at least one selected from the group consisting of a $Cl_2$ gas, an $SiCl_2$ gas, an $SiH_2Cl_2$ gas, an $SiCl_4$ gas, an $Si_2Cl_6$ gas, a $CHCl_3$ gas, a $CCl_4$ gas, and a $BCl_3$ gas.

In one exemplary embodiment, each of the first process gas and the second process gas contains the hydrogen fluoride gas with a highest partial pressure of non-inert components of each of the first process gas and the second process gas.

In one exemplary embodiment, at least one of the first process gas or the second process gas further includes at least one selected from the group consisting of a carbon-containing gas, an oxygen-containing gas, a carbon-free fluorine-containing gas, and a halogen-containing gas other than fluorine.

In one exemplary embodiment, the reaction inhibitor gas contained in the first process gas and the reaction inhibitor gas contained in the second process gas are of the same gas type.

In one exemplary embodiment, the reaction accelerator gas contained in the first process gas and the reaction accelerator gas contained in the second process gas are of the same gas type.

An etching method according to one exemplary embodiment of the present disclosure is implementable with a plasma processing apparatus including a chamber. The method includes (a) placing a substrate including a silicon-containing film and a mask on the silicon-containing film on a substrate support located in the chamber, and (b) etching the silicon-containing film. Step (b) includes (b-1) etching the silicon-containing film using plasma containing an active species of hydrogen fluoride generated from a first process gas, and (b-2) etching the silicon-containing film using plasma containing an active species of hydrogen fluoride generated from a second process gas. The first process gas contains, as a reaction control gas to control a reaction between hydrogen fluoride and the silicon-containing film, at least one of a reaction accelerator gas to accelerate the reaction or a reaction inhibitor gas to inhibit the reaction. The second process gas contains at least one of a reaction accelerator gas to accelerate the reaction or a reaction inhibitor gas to inhibit the reaction, or contains no reaction control gas. The reaction accelerator gas contained in the second process gas has a lower partial pressure than the reaction accelerator gas contained in the first process gas. The reaction inhibitor gas contained in the second process gas has a higher partial pressure than the reaction inhibitor gas contained in the first process gas.

In one exemplary embodiment, the active species of hydrogen fluoride is generated from at least one gas selected from the group consisting of a hydrogen fluoride gas and a hydrofluorocarbon gas.

In one exemplary embodiment, the active species of hydrogen fluoride is generated from a fluoride-containing gas and a hydrogen-containing gas.

A plasma processing system according to one exemplary embodiment of the present disclosure includes a chamber, a substrate support located in the chamber, a plasma generator, and a controller. The controller performs control to cause operations including (a) placing a substrate including a silicon-containing film and a mask on the silicon-containing film on the substrate support located in the chamber, and (b) etching the silicon-containing film. Step (b) includes (b-1) etching the silicon-containing film using plasma generated from a first process gas, and (b-2) etching the silicon-containing film using plasma generated from a second process gas. The first process gas contains a hydrogen fluoride gas and a reaction control gas to control a reaction between hydrogen fluoride and the silicon-containing film. The first process gas contains, as the reaction control gas, at least one of a reaction accelerator gas to accelerate the reaction or a reaction inhibitor gas to inhibit the reaction. The second process gas contains a hydrogen fluoride gas. The second process gas contains at least one of a reaction accelerator gas to accelerate the reaction or a reaction inhibitor gas to inhibit the reaction, or contains no reaction control gas. The reaction accelerator gas contained in the second process gas has a lower partial pressure than the reaction accelerator gas contained in the first process gas. The reaction inhibitor gas contained in the second process gas has a higher partial pressure than the reaction inhibitor gas contained in the first process gas.

One or more embodiments of the present disclosure will now be described with reference to the drawings. In the drawings, the same or similar components are given the same reference numerals and may not be described repeatedly. Unless otherwise specified, the positional relationships shown in the drawings are used to describe the vertical, lateral, and other positions. The drawings are not drawn to scale relative to the actual ratio of each component, and the actual ratio is not limited to the ratio in the drawings.

Example Structure of Plasma Processing System

An example structure of a plasma processing system will now be described. FIG. 1 is a diagram of a capacitively coupled plasma processing apparatus showing its example structure.

The plasma processing system includes a capacitively coupled plasma processing apparatus 1 and a controller 2. The capacitively coupled plasma processing apparatus 1 includes a plasma processing chamber 10, a gas supply unit 20, a power supply 30, and an exhaust system 40. The plasma processing apparatus 1 also includes a substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 has at least one gas inlet for supplying at least one process gas into the plasma processing space 10s and at least one gas outlet for discharging the gas from the plasma processing space. The plasma processing chamber 10 is grounded. The shower head 13 and the substrate support 11 are electrically insulated from a housing of the plasma processing chamber 10.

The substrate support 11 includes a body 111 and a ring assembly 112. The body 111 includes a central area 111a for supporting a substrate W and an annular area 111b for supporting the ring assembly 112. A wafer is an example of the substrate W. The annular area 111b of the body 111 surrounds the central area 111a of the body 111 as viewed in plan. The substrate W is located on the central area 111a of the body 111. The ring assembly 112 is located on the annular area 111b of the body 111 to surround the substrate W on the central area 111a of the body 111. Thus, the central area 111a is also referred to as a substrate support surface for supporting the substrate W, and the annular area 111b is also referred to as a ring support surface for supporting the ring assembly 112.

In one embodiment, the body 111 includes a base 1110 and an electrostatic chuck (ESC) 1111. The base 1110 includes a conductive member. The conductive member in the base 1110 may serve as a lower electrode. The ESC 1111 is located on the base 1110. The ESC 1111 includes a ceramic member 1111a and an electrostatic electrode 1111b located inside the ceramic member 1111a. The ceramic member 1111a includes the central area 111a. In one embodiment, the ceramic member 1111a also includes the annular area 111b. Other members surrounding the ESC 1111, such as an annular ESC or an annular insulating member, may include the annular area 111b. In this case, the ring assembly 112 may be located on the annular ESC or the annular insulating member, or may be located on both the ESC 1111 and the annular insulating member. A radio-frequency (RF) electrode or a direct-current (DC) electrode may also be located inside the ceramic member 1111a. In this case, the RF electrode or the DC electrode serves as a lower electrode. When a bias RF signal or a DC signal (described later) is provided to the RF electrode or the DC electrode, the RF electrode or the DC electrode is also referred to as a bias electrode. The conductive member in the base 1110 and the RF electrode or the DC electrode may serve as two lower electrodes.

The ring assembly 112 includes one or more annular members. In one embodiment, one or more annular members include one or more edge rings and at least one cover ring. The edge ring is formed from a conductive material or an insulating material. The cover ring is formed from an insulating material.

The substrate support 11 may also include a temperature control module that adjusts at least one of the ESC 1111, the ring assembly 112, or the substrate to a target temperature. The temperature control module may include a heater, a heat-transfer medium, a channel 1110a, or a combination of these. The channel 1110a allows a heat-transfer fluid such as brine or gas to flow. In one embodiment, the channel 1110a is defined in the base 1110, and one or more heaters are located in the ceramic member 1111a in the ESC 1111. The substrate support 11 may include a heat-transfer gas supply unit to supply a heat-transfer gas into a space between the back surface of the substrate W and the central area 111a.

The shower head 13 introduces at least one process gas from the gas supply unit 20 into the plasma processing space 10s. The shower head 13 has at least one gas inlet 13a, at least one gas-diffusion compartment 13b, and multiple gas inlet ports 13c. The process gas supplied to the gas inlet 13a passes through the gas-diffusion compartment 13b and is introduced into the plasma processing space 10s through the multiple gas inlet ports 13c. The shower head 13 also includes an upper electrode. In addition to the shower head 13, the gas inlet unit may include one or more side gas injectors (SGIs) that are installed in one or more openings in the side wall 10a.

The gas supply unit 20 may include at least one gas source 21 and at least one flow controller 22. In one embodiment, the gas supply unit 20 allows supply of at least one process gas from each gas source 21 to the shower head 13 through the corresponding flow controller 22. The flow controller 22 may include a mass flow controller or a pressure-based flow controller. The gas supply unit 20 may further include one or more flow rate modulators that supply at least one gas at a modulated flow rate or in a pulsed manner.

The power supply 30 includes the RF power supply 31 that is coupled to the plasma processing chamber 10 through at least one impedance matching circuit. The RF power supply 31 allows supply of at least one RF signal (RF power), such as a source RF signal or a bias RF signal, to at least one lower electrode or at least one upper electrode, or to both the electrodes. This causes plasma to be generated from at least one process gas supplied into the plasma processing space 10s. The RF power supply 31 may thus at least partially serve as a plasma generator that generates plasma from one or more process gases in the plasma processing chamber 10. A bias RF signal is provided to at least one lower electrode to generate a bias potential in the substrate W, thus drawing ion components in the plasma to the substrate W.

In one embodiment, the RF power supply 31 includes a first RF generator 31a and a second RF generator 31b. The first RF generator 31a is coupled to at least one lower electrode, to at least one upper electrode, or to both the electrodes through at least one impedance matching circuit and generates a source RF signal (source RF power) for plasma generation. In one embodiment, the source RF signal has a frequency in a range of 10 to 150 MHz. In one embodiment, the first RF generator 31a may generate multiple source RF signals with different frequencies. The generated one or more source RF signals are provided to at least one lower electrode, to at least one upper electrode, or to both the electrodes.

The second RF generator 31b is coupled to at least one lower electrode through at least one impedance matching circuit and generates a bias RF signal (bias RF power). The frequency of the bias RF signal may be the same as or different from the frequency of the source RF signal. In one embodiment, the bias RF signal has a lower frequency than the source RF signal. In one embodiment, the bias RF signal has a frequency in a range of 100 kHz to 60 MHz. In one embodiment, the second RF generator 31b may generate multiple bias RF signals with different frequencies. The generated one or more bias RF signals are provided to at least one lower electrode. In various embodiments, at least one of the source RF signal or the bias RF signal may be pulsed.

The power supply 30 may also include the DC power supply 32 coupled to the plasma processing chamber 10. The DC power supply 32 includes a first DC generator 32a and a second DC generator 32b. In one embodiment, the first DC generator 32a is connected to at least one lower electrode and generates a first DC signal. The generated first bias DC signal is applied to at least one lower electrode. In one embodiment, the second DC generator 32b is connected to at least one upper electrode and generates a second DC signal. The generated second DC signal is applied to at least one upper electrode.

In various embodiments, at least one of the first DC signal or the second DC signal may be pulsed. In this case, a sequence of voltage pulses based on DC is applied to at least one lower electrode, to at least one upper electrode, or to both the electrodes. The voltage pulse may have a rectangular, trapezoidal, or triangular pulse waveform, or a combination of these pulse waveforms. In one embodiment, a waveform generator for generating a sequence of voltage pulses based on DC signals is connected between the first DC generator 32a and at least one lower electrode. Thus, the first DC generator 32a and the waveform generator are included in a voltage pulse generator. When the second DC generator 32b and the waveform generator are included in a voltage pulse generator, the voltage pulse generator is connected to at least one upper electrode. The voltage pulses may have positive or negative polarity. The sequence of voltage pulses may also include one or more positive voltage pulses and one or more negative voltage pulses within one cycle. The first DC generator 32a and the second DC generator 32b may be provided in addition to the RF power supply 31, or the first DC generator 32a may replace the second RF generator 31b.

The exhaust system 40 may be, for example, connected to a gas outlet 10e in the bottom of the plasma processing chamber 10. The exhaust system 40 may include a pressure control valve and a vacuum pump. The pressure control valve regulates the pressure in the plasma processing space 10s. The vacuum pump may include a turbomolecular pump, a dry pump, or a combination of these.

The controller 2 processes computer-executable instructions that cause the plasma processing apparatus 1 to perform various steps described in one or more embodiments of the present disclosure. The controller 2 may control the components of the plasma processing apparatus 1 to perform various steps described herein. In one embodiment, some or all of the components of the controller 2 may be included in the plasma processing apparatus 1. The controller 2 may include a computer 2a. The computer 2a may include a central processing unit (CPU) 2al, a storage 2a2, and a communication interface 2a3. The processor 2al may perform various control operations by reading a program from the storage 2a2 and executing the read program. This program may be prestored in the storage 2a2 or may be obtained through a medium as appropriate. The obtained program is stored into the storage 2a2, read from the storage 2a2, and executed by the processor 2a1. The medium may be one of various storage media readable by the computer 2a, or a communication line connected to the communication interface 2a3. The storage 2a2 may be a random-access memory (RAM), a read-only memory (ROM), a hard disk drive (HDD), a solid-state drive (SSD), or a combination of these memories. The communication interface 2a3 may communicate with the plasma processing apparatus 1 through a communication line such as a local area network (LAN).

Example Etching Method

Figure 2:
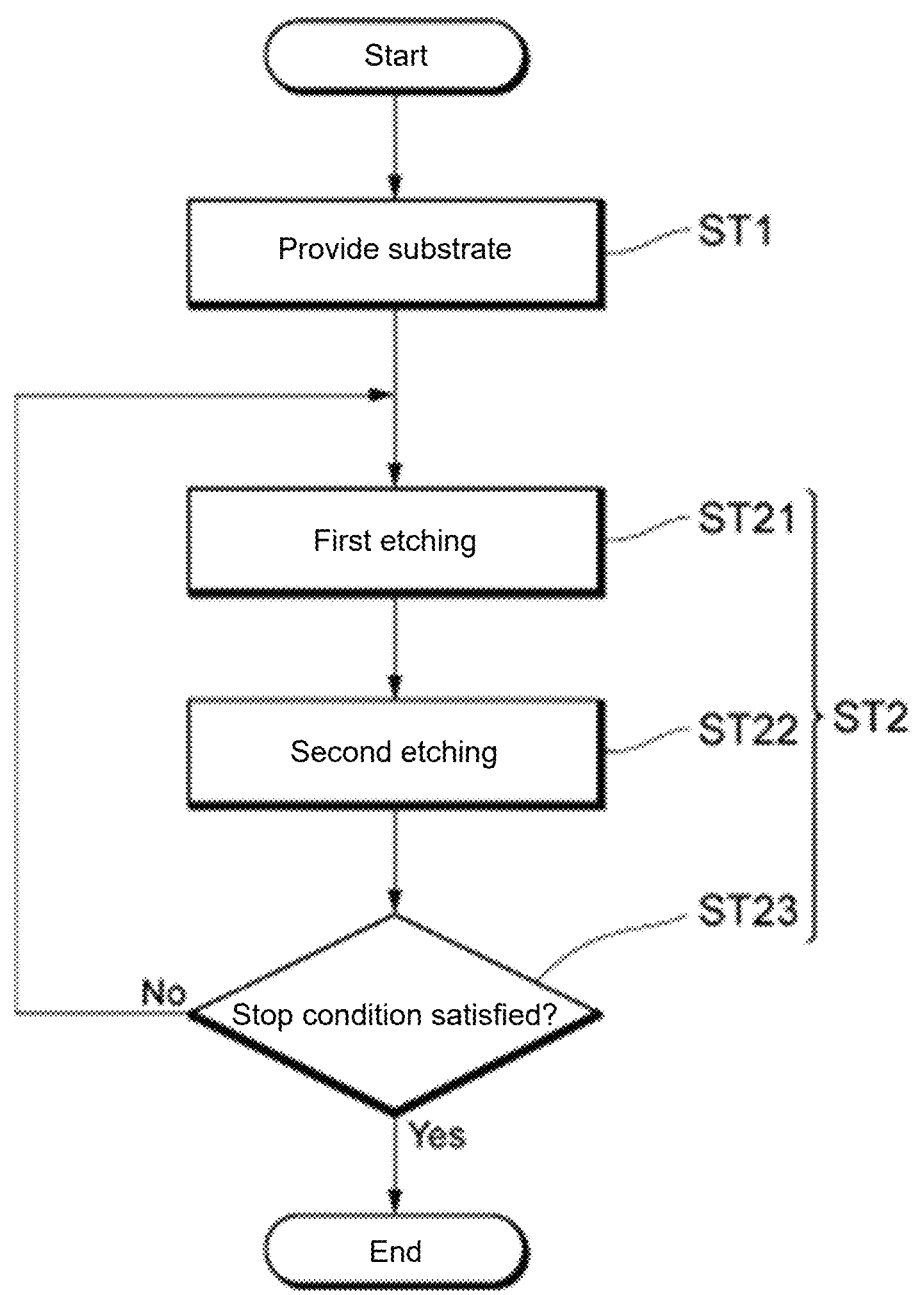
FIG. 2 is a flowchart of a processing method according to an exemplary embodiment.

FIG. 2 is a flowchart of a processing method (hereinafter referred to as the processing method) according to an exemplary embodiment. As shown in FIG. 2, the processing method includes step ST1 for providing a substrate and step ST2 for etching a silicon-containing film in the substrate. The processing in each step may be performed in the plasma processing system shown in FIG. 1. The controller 2 controls the components of the plasma processing apparatus 1 to perform the processing method on a substrate W.
Step ST1: Providing Substrate
In step ST1, the substrate W is provided into the plasma processing space 10s in the plasma processing apparatus 1. The substrate W is placed on the central area 11a included in the substrate support 11. The substrate W is held on the substrate support 11 by the ESC 1111.

Figure 3:
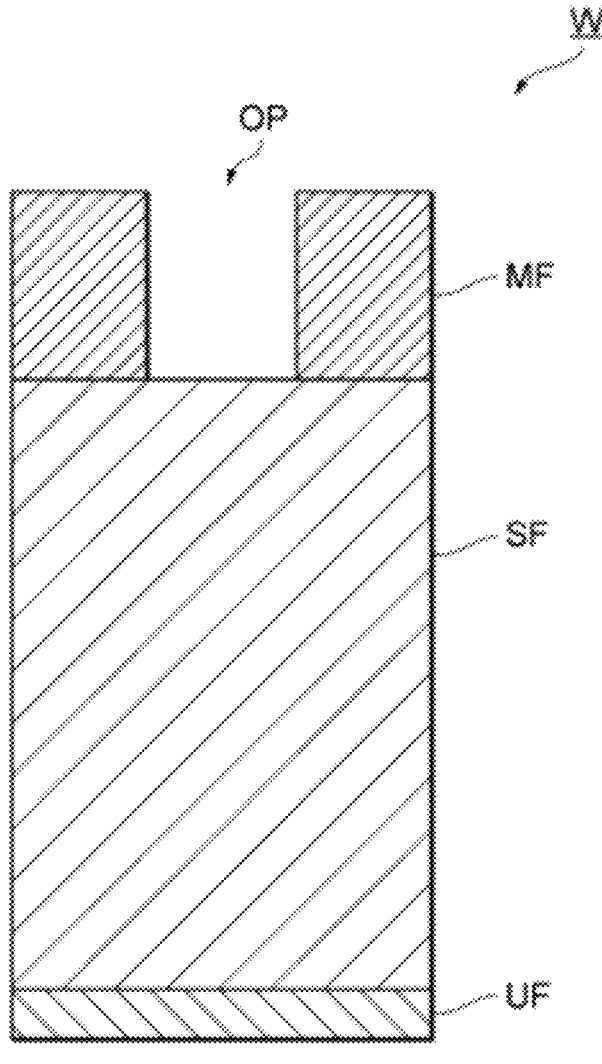
FIG. 3 is a diagram of a substrate W showing an example cross-sectional structure.

FIG. 3 is a diagram of the substrate W provided in step ST1, showing an example cross-sectional structure. The substrate W includes a silicon-containing film SF and a mask MF stacked on an underlying film UF in this order. The substrate W may be used for manufacturing semiconductor devices. Examples of the semiconductor devices include semiconductor memory devices such as a dynamic random-access memory (DRAM) and a 3D-NAND flash memory.

The underlying film UF may be, for example, a silicon wafer or an organic film, a dielectric film, a metal film, or a semiconductor film formed on the silicon wafer. The underlying film UF may include multiple films stacked on one another.

The silicon-containing film SF is a target of etching with the processing method. Examples of the silicon-containing film SF include a silicon oxide film, a silicon nitride film, a silicon oxynitride film, and a polycrystalline silicon film. The silicon-containing film SF may include multiple films stacked on one another. For example, the silicon-containing film SF may include silicon oxide films and silicon nitride films alternately stacked on one another. For example, the silicon-containing film SF may include silicon oxide films and polycrystalline silicon films alternately stacked on one another.

The mask MF is a film that serves as a mask in the etching of the silicon-containing film SF. The mask MF may be, for example, a polysilicon film, a boron-doped silicon film, a tungsten-containing film (e.g., a WC film or a WSi film), an amorphous carbon film, a tin oxide film, or a titanium-containing film (e.g., a TiN film).

As shown in FIG. 3, the mask MF may define at least one opening OP above the silicon-containing film SF. The opening OP is a space above the silicon-containing film SF, surrounded by a side wall of the mask MF. In other words, the upper surface of the silicon-containing film SF includes a portion covered with the mask MF and a portion exposed through the bottom of the opening OP.

The opening OP may have any feature in a plan view of the substrate W, or in other words, when the substrate W is viewed from the top toward the bottom in FIG. 3. The opening feature may be, for example, a circle, an oval, a rectangle, a line, or a combination of one or more of these features. The mask MF may have multiple sidewalls, which may define multiple openings OP. The multiple openings OP may be slits arranged in a pattern of lines and spaces at regular intervals. The multiple openings OP may be holes arranged in a patterned array.

The films (the underlying film UF, the silicon-containing film SF, and the mask MF) included in the substrate W may each be formed by chemical vapor deposition (CVD), atomic layer deposition (ALD), spin coating, or other methods. The opening OP may be formed by etching the mask MR The mask MF may also be formed by lithography. The films may each be a flat film or an uneven film. The substrate W may further include another film under the underlying film UF. The stacked film of the silicon-containing film SF and the underlying film UF may then serve as a multilayer mask. In other words, the stacked films of the silicon-containing film SF and the underlying film UF may be used as a multilayer mask to etch the other film.

The processing for forming each film included in the substrate W may be at least partly performed in a space in the plasma processing chamber 10. In one example, the step of etching the mask MF to form the opening OP may be performed in the plasma processing chamber 10. In other words, the etching of the opening OP and the etching of the silicon-containing film SF (described later) may be performed continuously in the same chamber. All or some of the films included in the substrate W may be formed in a device or a chamber external to the plasma processing apparatus 1. The resultant substrate W may then be loaded into the plasma processing space 10s in the plasma processing apparatus 1 and placed on the central area 111a of the substrate support 11.

After the substrate W is placed on the central area 111a of the substrate support 11, the temperature of the substrate support 11 is adjusted to a set temperature by the temperature control module. The set temperature may be, for example, lower than or equal to 70, 0, −10, −20, −30, −40, −50, −60, or −70° C. In one example, adjusting or maintaining the temperature of the substrate support 11 includes adjusting or maintaining the temperature of the heat-transfer fluid flowing in the channel 1110a to a set temperature or a temperature different from the set temperature. In one example, adjusting or maintaining the temperature of the substrate support 11 includes controlling the pressure of the heat-transfer gas (e.g., He) between the ESC 1111 and the back surface of the substrate W. The heat-transfer fluid may start to flow in the channel 1110a before, after, or at the same time as the substrate W is placed on the substrate support 11. The temperature of the substrate support 11 may be adjusted to the set temperature before step ST1 with the processing method. In other words, the substrate W may be placed on the substrate support 11 after the temperature of the substrate support 11 is adjusted to the set temperature.

Step ST2: Etching

In step ST2, the silicon-containing film SF in the substrate W is etched. Step ST2 includes step ST21 of performing first etching and step ST22 of performing second etching. Step ST2 may also include step ST23 of determining whether a stop condition for etching is satisfied. More specifically, step ST21 and step ST22 may be repeated alternately until the stop condition is determined to be satisfied in step ST23. During the processing in step ST2, the temperature of the substrate support 11 is maintained at the set temperature reached by the adjustment in step ST1.

Step ST21: First Etching

In step ST21, plasma generated from a first process gas is used for etching the silicon-containing film SF. The gas supply unit 20 first supplies the first process gas into the plasma processing space 10s. The first process gas contains a hydrogen fluoride (HF) gas and a reaction control gas for controlling a reaction between hydrogen fluoride and the silicon-containing film. The first process gas may contain, as a reaction control gas, a reaction accelerator gas for accelerating a reaction between hydrogen fluoride and the silicon-containing film. The first process gas may contain a reaction inhibitor gas for inhibiting the reaction. The first process gas may contain both the reaction accelerator gas and the reaction inhibitor gas.

A source RF signal is then provided to the lower electrode of the substrate support 11, to the upper electrode of the shower head 13, or to both the electrodes. This causes generation of an RF electric field between the shower head 13 and the substrate support 11, and generation of plasma from the first process gas in the plasma processing space 10s. A bias signal is also provided to the lower electrode of the substrate support 11 to generate a bias potential between the plasma and the substrate W. The bias potential attracts an active species such as ions and radicals in the plasma to the substrate W. The active species etches the silicon-containing film SF.

Step ST22: Second Etching

In step ST22 of the second etching, plasma generated from the second process gas is used for further etching the silicon-containing film SF. The gas supply unit 20 supplies a second process gas into the plasma processing space 10s. The second process gas contains an HF gas.

The second process gas may contain at least one of a reaction accelerator gas for accelerating a reaction between hydrogen fluoride and the silicon-containing film and a reaction inhibitor gas for inhibiting the reaction. For the second process gas containing a reaction accelerator gas, the reaction accelerator gas may have a lower partial pressure than the reaction accelerator gas contained in the first process gas. For the second process gas containing a reaction inhibitor gas, the reaction inhibitor gas may have a higher partial pressure than the reaction inhibitor gas contained in the first process gas. For the second process gas containing both a reaction accelerator gas and a reaction inhibitor gas, the reaction accelerator gas may have a lower partial pressure than the reaction accelerator gas contained in the first process gas, or the reaction inhibitor gas may have a higher partial pressure than the reaction inhibitor gas contained in the first process gas, or both.

The second process gas may not contain a gas for controlling (inhibiting or accelerating) a reaction between hydrogen fluoride and the silicon-containing film.

As in step ST21, a source RF signal is then provided to the lower electrode of the substrate support 11, to the upper electrode of the shower head 13, or to both the electrodes. This causes generation of an RF electric field between the shower head 13 and the substrate support 11, and generation of plasma from the second process gas in the plasma processing space 10s. A bias signal is also provided to the lower electrode of the substrate support 11 to generate a bias potential between the plasma and the substrate W. The bias potential attracts an active species such as ions and radicals in the plasma to the substrate W. The active species further etches the silicon-containing film SF.

The shift from step ST21 to step ST22 may be performed based on, for example, at least one of the depth of a recess formed in the silicon-containing film SF through etching, the aspect ratio of the recess, or the etching time.

In steps ST21 and ST22, the bias signal may be a bias RF signal provided from the second RF generator 31b. The bias signal may be a bias DC signal provided from the DC generator 32a. In some embodiments, the bias signal may not be provided in steps ST21 and ST22.

In steps ST21 and ST22, the source RF signal and the bias signal may both be continuous waves or pulsed waves, or one signal may be continuous and the other signal may be pulsed. When both the source RF signal and the bias signal are pulsed, the cycles of the two pulsed waves may be synchronized. A bias DC signal used may have a rectangular, trapezoidal, or triangular pulse waveform, or a combination of these pulse waveforms. The bias DC signal may have either negative or positive polarity, and may adjust the potential of the substrate W to create a potential difference between the plasma and the substrate to draw ions.

With either the source RF signal or the bias signal being pulsed, the duty ratio of the pulsed wave may be set as appropriate to, for example, 1 to 80% or 5 to 50%. The duty ratio is the percentage of the period in which the level of power or the level of voltage is higher in a pulse wave cycle. The duty ratio of the pulsed wave may be the same or different in step ST21 and in step ST22. In one example, the duty ratio of the pulsed wave of the source RF signal in step ST22 may be set lower than the duty ratio of the pulsed wave of the source RF signal in step ST21. Setting a lower duty ratio causes less heat to enter the substrate W from the plasma, thus allowing the temperature of the substrate W to be lower than in step ST22. Hydrogen fluoride tends to adsorb more easily to the silicon-containing film SF in the substrate W at a lower temperature. Setting a lower duty ratio can thus accelerate adsorption of hydrogen fluoride to the silicon-containing film SF.

Step ST23: Stop Determination

In step ST23, the determination is performed as to whether the stop condition is satisfied. The stop condition may be, for example, whether the number of times one cycle of step ST21 and step ST22 is repeated has reached a predetermined number. The stop condition may be, for example, whether the etching time has reached a predetermined duration. The stop condition may be, for example, whether the depth of a recess formed by etching has reached a predetermined depth. When the stop condition is not satisfied in step ST23, the cycle of step ST21 and step ST22 is repeated. When the stop condition is satisfied in step ST23, the processing method ends. In addition to step ST23, the determination as to whether the stop condition is satisfied may also be performed between step ST21 and step ST22.

Process Gas Composition

The first process gas may include an HF gas with the highest partial pressure of all non-inert components of the first process gas. The second process gas may include an HF gas with the highest partial pressure of all non-inert components of the second process gas. In one example, the first process gas, the second process gas, or each of these gases may contain the HF gas by at least 50, 60, 70, or 80 vol % of the total flow rate of all non-inert components of the process gas. The HF gas may have a high purity of, for example, 99.999% or more.

The reaction accelerator gas in the first process gas, the second process gas, or each of these gases may be a gas for accelerating the adsorption of an active species of hydrogen fluoride in the plasma to the silicon-containing film SF (adsorption accelerating gas). The active species of hydrogen fluoride includes at least any of an HF gas, radicals, or ions. The reaction accelerator gas may further contain at least one selected from the group consisting of a phosphorus-containing gas, a nitrogen-containing gas, and a hydrogen-containing gas. For the first process gas and the second process gas each containing a reaction accelerator gas, the reaction accelerator gas contained in the first process gas may be of the same type or of a different type from the reaction accelerator gas contained in the second process gas.

The phosphorus-containing gas contains a phosphorus-containing molecule. The phosphorus-containing molecule may be an oxide such as tetraphosphorus decaoxide ($P_4O_{10}$), tetraphosphorus octoxide ($P_4O_8$), or tetraphosphorus hexaoxide ($P_4O_6$). Tetraphosphorus decaoxide may also be called diphosphorus pentaoxide ($P_2O_5$). The phosphorus-containing molecule may be a halide (phosphorus halide) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). More specifically, the halogen contained in the phosphorus-containing molecule may be fluorine in, for example, a phosphorus fluoride. In some embodiments, the phosphorus-containing molecule may contain a non-fluorine halogen. The phosphorus-containing molecule may be a phosphoryl halide such as phosphoryl fluoride ($POF_3$), phosphoryl chloride ($POCl_3$), or phosphoryl bromide ($POBr_3$). The phosphorus-containing molecule may be phosphine ($PH_3$), calcium phosphide (e.g., $Ca_3P_2$), phosphoric acid ($H_3PO_4$), sodium phosphate ($Na_3PO_4$), or hexafluorophosphoric acid ($HPF_6$). The phosphorus-containing molecule may be a fluorophosphine ($H_gPF_h$), where the sum of g and h is 3 or 5. The fluorophosphine may be, for example, $HPF_2$ or $H_2PF_3$. The process gas may contain at least one phosphorus-containing molecule selected from the above phosphorus-containing molecules. For example, the process gas may contain at least one phosphorus-containing molecule selected from the group consisting of $PF_3$, $PCl_3$, $PF_5$, $PCl_5$, $POCl_3$, $PH_3$, $PBr_3$, and $PBr_5$. Each phosphorus-containing molecule in either liquid or solid form may be vaporized by, for example, heating before being supplied into the plasma processing space 10s.

The nitrogen-containing gas may be at least one selected from the group consisting of an $NH_3$ gas, an $NF_3$ gas, an NO gas, and an $NO_2$ gas.

The hydrogen-containing gas may be a gas having a hydroxyl group. The hydrogen-containing gas may be at least one selected from the group consisting of an $H_2O$ gas, an $H_2O_2$ gas, and alcohol.

The reaction inhibitor gas in the first process gas, the second process gas, or each of these gases may be, for example, a gas that inhibits the reaction between an active species of hydrogen fluoride in the plasma and the silicon-containing film SF by removing (scavenging) an active species of hydrogen in the plasma. For example, the reaction inhibitor gas may be a chlorine-containing gas. In one example, the chlorine-containing gas may be at least one selected from the group consisting of a $Cl_2$ gas, an $SiCl_2$ gas, an $SiH_2Cl_2$ gas, an $SiCl_4$ gas, an $Si_2Cl_6$ gas, a $CHCl_3$ gas, a $CCl_4$ gas, and a $BCl_3$ gas. For the first process gas and the second process gas each containing a reaction inhibitor gas, the reaction inhibitor gas contained in the first process gas may be of the same or of a different type from the reaction inhibitor gas contained in the second process gas.

The first process gas, the second process gas, or both these gases may further contain a carbon-containing gas. The carbon-containing gas may be, for example, either or both of a fluorocarbon gas and a hydrofluorocarbon gas. In one example, the fluorocarbon gas may be at least one selected from the group consisting of a $CF_4$ gas, a $C_2F_2$ gas, a $C_2F_4$ gas, a $C_3F_6$ gas, a $C_3F_8$ gas, a $C_4F_6$ gas, and a $C_4F_8$ gas, and a $C_5F_8$ gas. In one example, the hydrofluorocarbon gas may be at least one selected from the group consisting of a $CHF_3$ gas, a $CH_2F_2$ gas, a $CH_3F$ gas, a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. The carbon-containing gas may have a linear chain structure with unsaturated bonds. The linear carbon-containing gas with unsaturated bonds may be, for example, at least one selected from the group consisting of a $C_3F_6$ (hexafluoropropene) gas, a $C_4F_8$ (octafluoro-1-butene, octafluoro-2-butene) gas, a $C_3H_2F_4$ (1,3,3,3-tetrafluoropropene) gas, a $C_4H_2F_6$ (trans-1,1,1,4,4,4-hexafluoro-2-butene) gas, a $C_4F_8O$ (pentafluoroethyl trifluorovinyl ether) gas, a $CF_3COF$ gas (1,2,2,2-tetrafluoroethane-1-one), a $CHF_2COF$ (difluoroacetic acid fluoride) gas, and a $COF_2$ (carbonyl fluoride) gas.

The first process gas, the second process gas, or both these gases may further contain an oxygen-containing gas. The oxygen-containing gas may be, for example, at least one gas selected from the group consisting of $O_2$, a CO, and $CO_2$.

The first process gas, the second process gas, or both these gases may further contain a carbon-free fluorine-containing gas. In one example, the carbon-free fluorine-containing gas may be at least one selected from the group consisting of $SF_6$, $NF_3$, $XeF_2$, $SiF_4$, $IF_5$, $IF_7$, $BrF_5$, $AsF_5$, $NF_5$, $BF_3$, and $WF_6$.

The first process gas, the second process gas, or both these gases may further contain a halogen-containing gas other than fluorine. The halogen-containing gas other than fluorine may be, for example, at least one selected from the group consisting of an HBr gas, an HI gas, and an $I_2$ gas.

The first process gas, the second process gas, or both these gases may further contain an inert gas. In one example, the inert gas may be a noble gas such as an Ar gas, a He gas, a Kr gas, or an $N_2$ gas.

The first process gas, the second process gas, or both these gases may contain, instead of or in addition to the HF gas, a gas for generating an HF species in the plasma.

The gas for generating an HF species is, for example, a hydrofluorocarbon gas. The hydrofluorocarbon gas may have at least two, three, or four carbon atoms. In one example, the hydrofluorocarbon gas is at least one selected from the group consisting of a $CH_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_5$ gas, a $C_5H_2F_6$ gas, a $C_5H_2F_{10}$ gas, and a $C_5H_3F_7$ gas. In one example, the hydrofluorocarbon gas is at least one selected from the group consisting of a $CH_2F_2$ gas, a $C_3H_2F_4$ gas, a $C_3H_2F_6$ gas, and a $C_4H_2F_6$ gas.

The gas for generating an HF species is, for example, a fluorine-containing gas or a hydrogen-containing gas. The fluorine-containing gas is, for example, a fluorocarbon gas. In one example, the fluorocarbon gas is at least one selected from the group consisting of a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. The fluorine-containing gas may be, for example, an $NF_3$ gas or an $SF_6$ gas. In one example, the hydrogen-containing gas is at least one selected from the group consisting of an $H_2$ gas, a $CH_4$ gas, and an $NH_3$ gas.

Example of Step ST2

Figure 4:
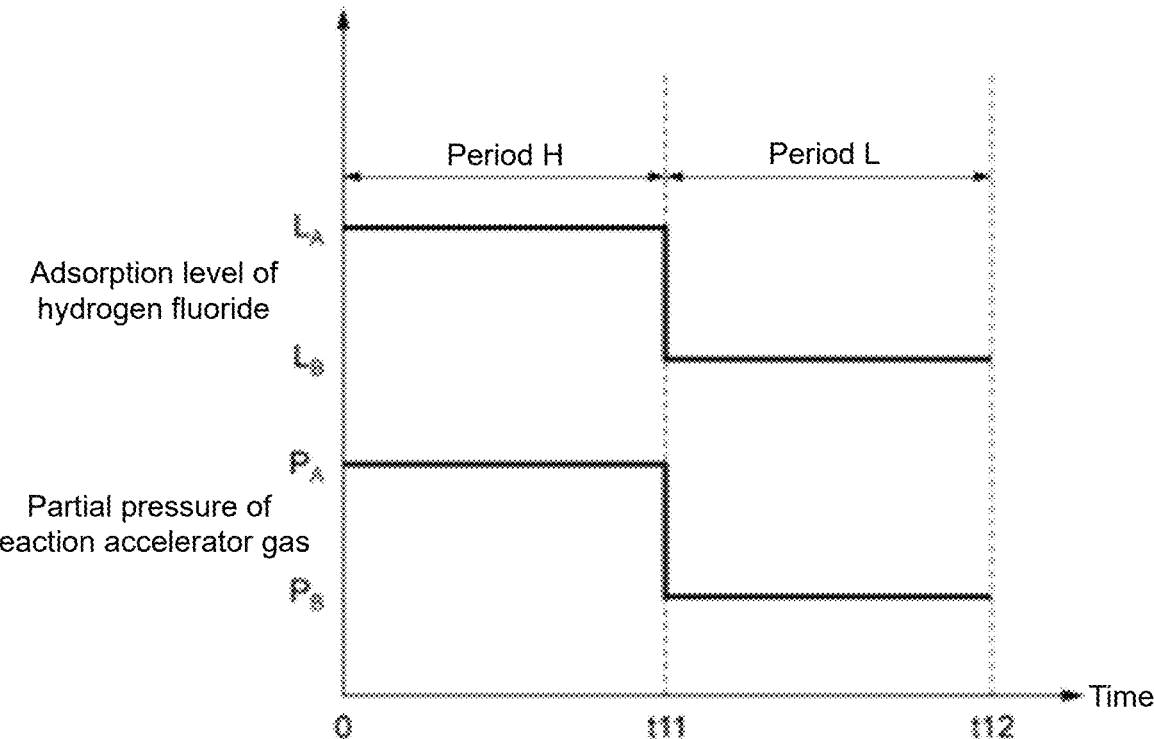
FIG. 4 is an example timing chart for step ST2 using a reaction accelerator gas.

FIG. 4 is an example timing chart for step ST2 using a reaction accelerator gas. FIG. 4 shows an example of etching of the silicon-containing film SF in one cycle of step ST21 of the first etching and step ST2 of the second etching using a reaction accelerator gas as the reaction control gas. In FIG. 4, the vertical axis indicates the partial pressure of the reaction accelerator gas in the first process gas or in the second process gas and the level of adsorption of hydrogen fluoride to the silicon-containing film SF. The horizontal axis indicates the etching time. In the figure, $P_B$ indicates, for the reaction accelerator gas, a partial pressure of zero or a partial pressure lower than a partial pressure indicated by $P_A$. In the figure, $L_B$ indicates the adsorption level (adsorption amount) of hydrogen fluoride to the silicon-containing film SF less than that of $L_A$. In FIG. 4, times 0 to t11 correspond to step ST21 (this period is hereinafter referred to as the period H), and times t11 to t12 correspond to step ST22 (this period is hereinafter referred to as the period L).

In FIG. 4, the partial pressure of the reaction accelerator gas is constant within each period (the period H and period L), but may vary (decrease, increase, or increase and decrease) in a stepwise manner or sequentially within each period. In this case, the adsorption level of the HF gas can change to follow the variation.

Figure 5:
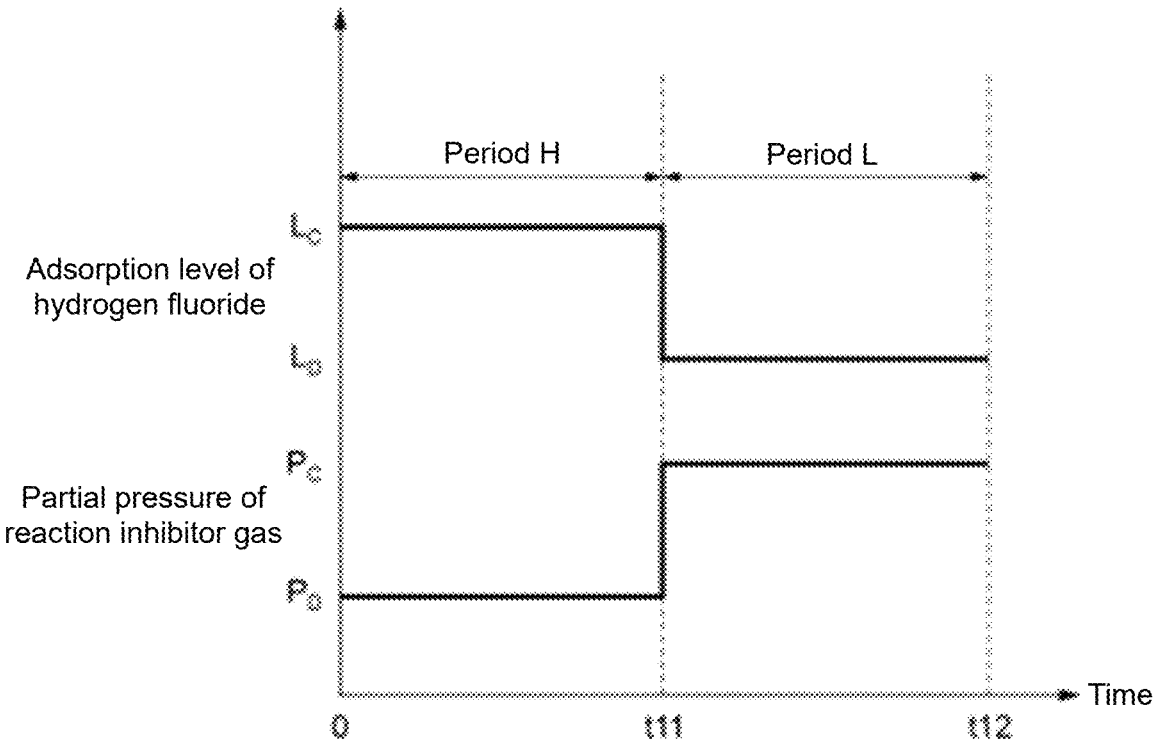
FIG. 5 is an example timing chart for step ST2 using a reaction inhibitor gas.

FIG. 4 is a timing chart for step ST2 using a reaction accelerator gas as the reaction control gas. Instead of or in addition to this, a reaction inhibitor gas may be used as the reaction control gas. FIG. 5 is an example timing chart for step ST2 using a reaction inhibitor gas. As shown in FIG. 5, the partial pressure of the reaction inhibitor gas may be low or zero ($P_D$) in the period H and high ($P_C$) in the period L. The adsorption level ($L_C$) of hydrogen fluoride in the period H is higher than the adsorption level ($L_D$) in the period L.

Figure 6A:
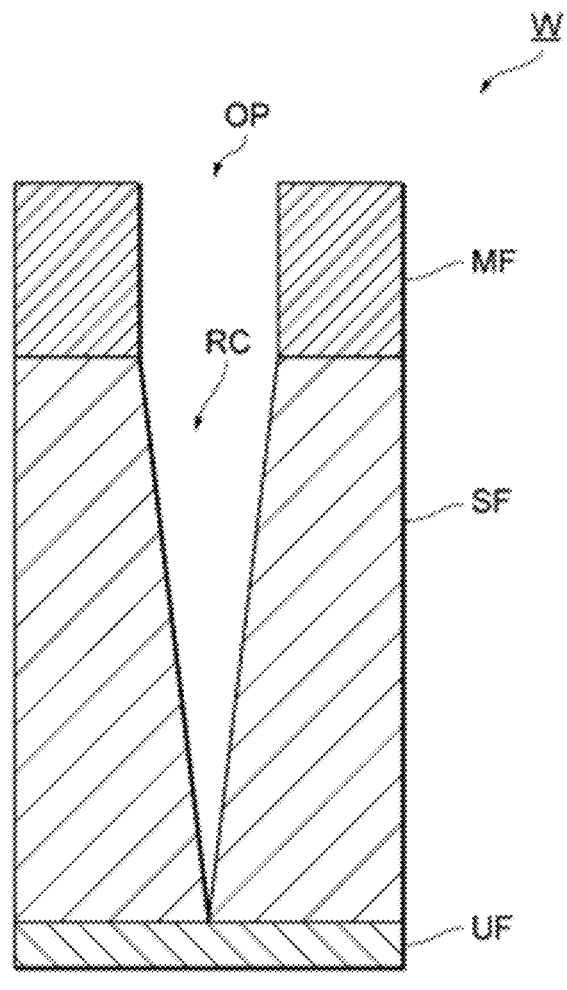
FIG. 6A is a diagram of the substrate W showing an example cross-sectional structure at the end of a period H.
Figure 6B:
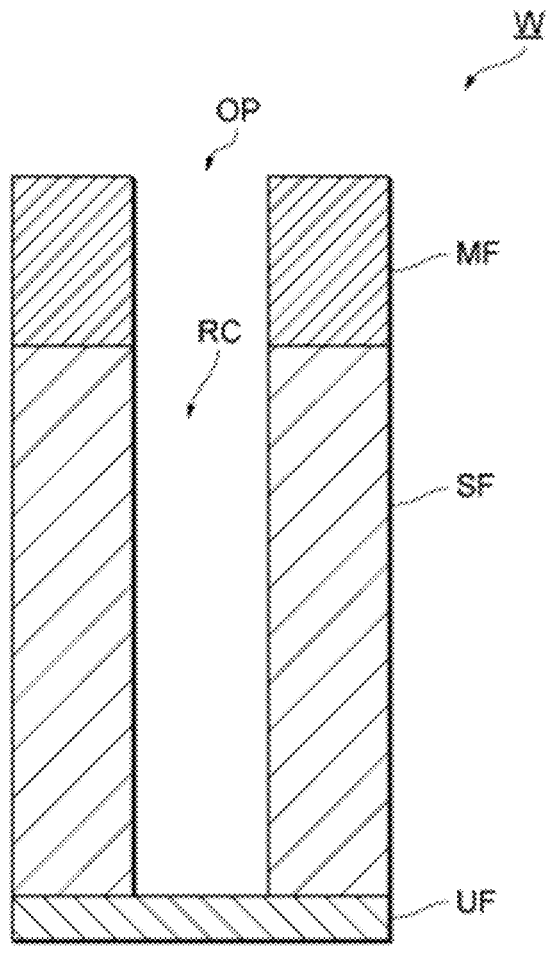
FIG. 6B is a diagram of the substrate W showing an example cross-sectional structure at the end of a period L.

FIG. 6A is a diagram of the substrate W showing an example cross-sectional structure at the end of the period H (step ST21) (time t1*l*) in FIG. 4 or FIG. 5. FIG. 6B is a diagram of the substrate W showing an example cross-sectional structure at the end of the period L (step ST22) (time t12) in FIG. 4 or FIG. 5.

As shown in FIG. 6A, in the processing in the period H (step ST21), the portion of the silicon-containing film SF exposed through the opening OP is etched in the depth direction (from the top to the bottom in FIG. 6A) to form a recess RC. In the period H, the silicon-containing film SF may be etched until or immediately before the bottom of the recess RC reaches the underlying film UF.

In the period H (step ST21), the adsorption level ($L_A$ or $L_C$) of hydrogen fluoride to the silicon-containing film is greater than in the period L (step ST21) (refer to FIGS. 4 and 5). This accelerates the adsorption of hydrogen fluoride to the silicon-containing film SF in the period H. The silicon-containing film SF is etched at a higher etching rate in the period H than in the period L. In the period H, more reaction products (byproducts) are produced from etching than in the period L. The reaction byproducts can adsorb to the side-walls of the recess RC and prevent etching in the horizontal direction (left to right in FIG. 6A). This causes the recess RC to be tapered in the depth direction (refer to FIG. 6A).

In the subsequent period L (step ST22), the adsorption level ($L_B$ or $L_D$) of hydrogen fluoride to the silicon-containing film is lower than in the period H (step ST21) (refer to FIGS. 4 and 5). This causes less hydrogen fluoride to adsorb to the silicon-containing film SF in the period L. The silicon-containing film SF is etched at a lower etching rate in the period L than in the period H. In the period L, less reaction byproducts are produced from etching than in the period H. This causes less reaction byproducts to adsorb to the sidewalls of the recess RC. This causes etching to proceed in the horizontal direction, and causes the recess RC that is tapered to be close to a rectangular shape (refer to FIG. 6B). More specifically, the recess RC has higher verticality.

In the example shown in FIG. 4 or FIG. 5, the silicon-containing film SF is etched with a high etching rate in the period H (step ST21), and then the bottom of the recess RC of the silicon-containing film SF is widened in the period L (step ST22). This prevents the overall etching rate from decreasing in step ST2, increases the verticality of the recess, and reduces feature failures in etching.

Other Examples of Step ST2

Figure 7:
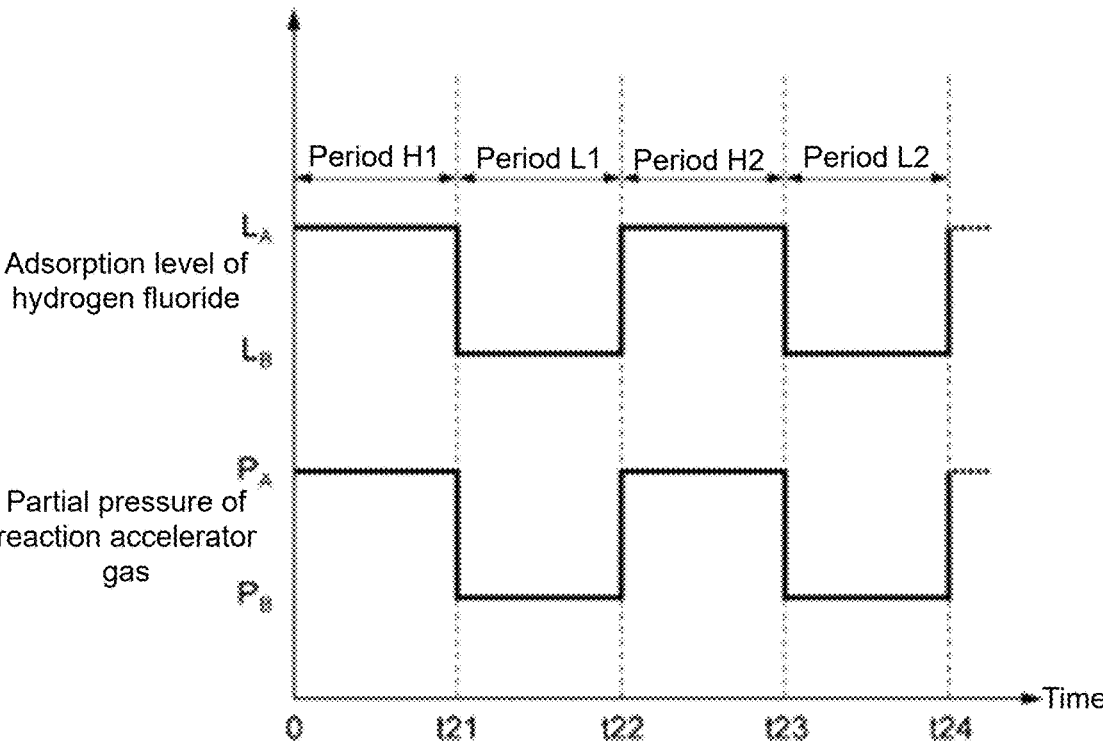
FIG. 7 is another example timing chart for step ST2 using a reaction accelerator gas.

FIG. 7 is another example timing chart for step ST2 using a reaction accelerator gas. FIG. 7 shows an example of etching of the silicon-containing film SF in repeated multiple cycles of step ST21 of the first etching and step ST2 of the second etching using a reaction accelerator gas as the reaction control gas. The vertical axis and the horizontal axis in FIG. 7 are the same as the axes in FIG. 4, with $P_B$ indicating, for the reaction accelerator gas, a partial pressure of zero or a partial pressure lower than a partial pressure indicated by $P_A$. In the figure, $L_B$ indicates the adsorption level (adsorption amount) of hydrogen fluoride to the silicon-containing film SF less than that of $L_A$. In FIG. 7, for example, times 0 to t21 and times t22 to t23 correspond to step ST21 (these periods are hereinafter referred to as the period $H_1$, the period $H_2$, or other periods). For example, times t21 to t22 and times t23 to t24 correspond to step ST22 (these periods are hereinafter referred to as the period L1, the period L2, or other periods).

In FIG. 7, the partial pressure of the reaction accelerator gas is constant in each period (the period $H_1$, period $H_2$, period L1, and period L2), but may vary (decrease, increase, or increase and decrease) in a stepwise manner or sequentially within each period. In this case, the adsorption level of hydrogen fluoride can change to follow the variation.

Figure 8:
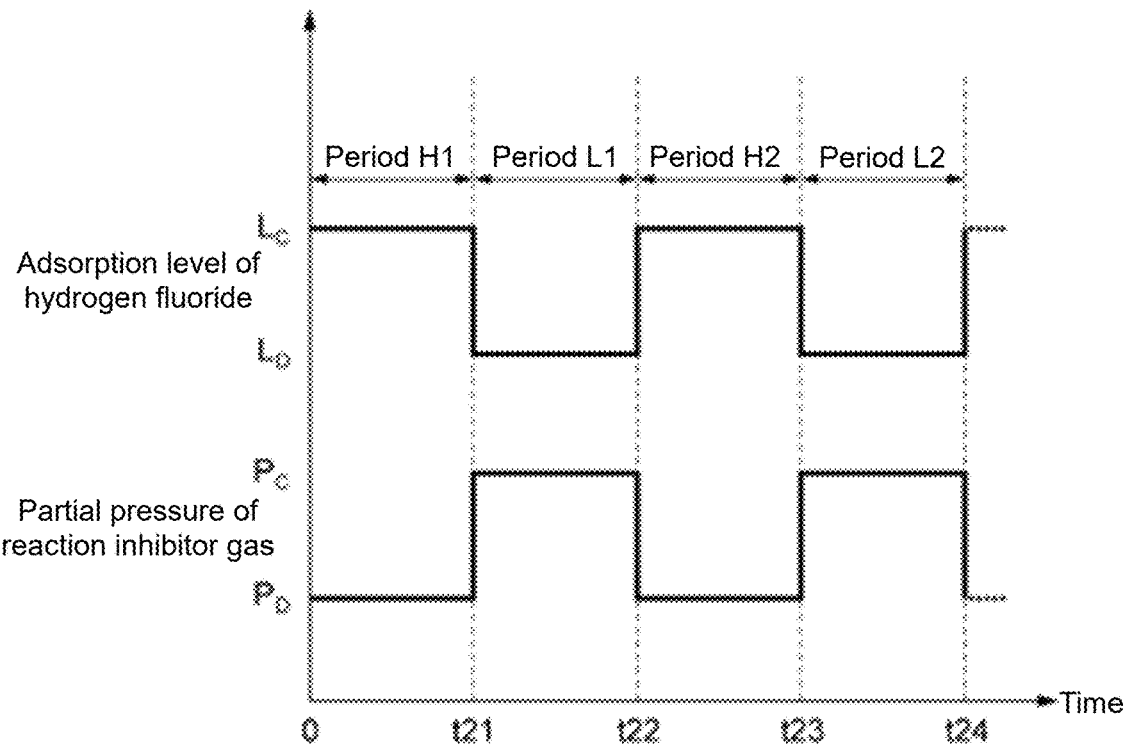
FIG. 8 is another example timing chart for step ST2 using a reaction inhibitor gas.

FIG. 7 is a timing chart for step ST2 using a reaction accelerator gas as the reaction control gas. Instead of or in addition to this, a reaction inhibitor gas may be used as the reaction control gas. FIG. 8 is another example timing chart for step ST2 using a reaction inhibitor gas. As shown in FIG. 8, the partial pressure of the reaction inhibitor gas may be low or zero ($P_D$) in step ST1 (the period $H_1$ and period $H_2$) and high ($P_C$) in step ST2 (the period L1 and period L2). The adsorption level ($L_C$) of hydrogen fluoride in step ST1 (the period $H_1$ and period $H_2$) is higher than the adsorption level ($L_D$) of hydrogen fluoride in step ST2 (the period L1 and period L2).

Figure 9A:
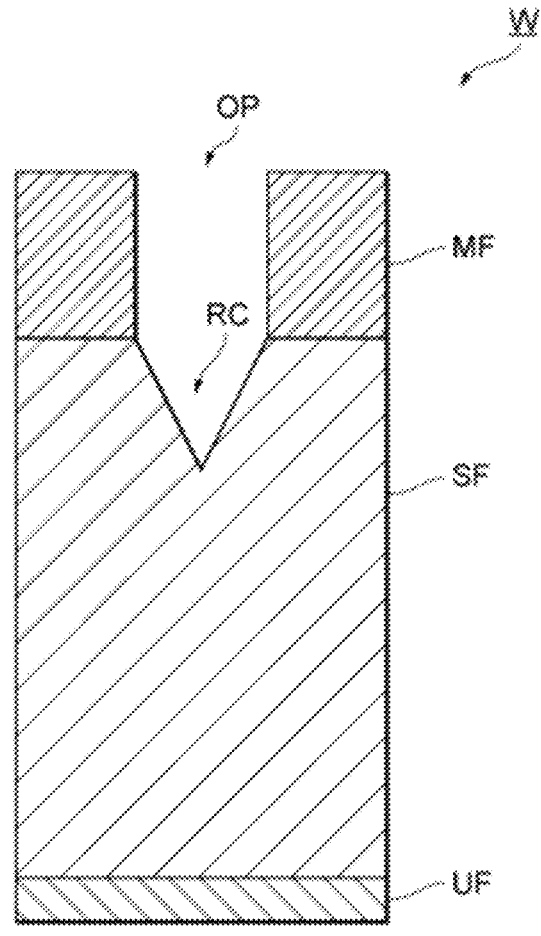
FIG. 9A is a diagram of the substrate W showing an example cross-sectional structure at the end of a period H1.
Figure 9B:
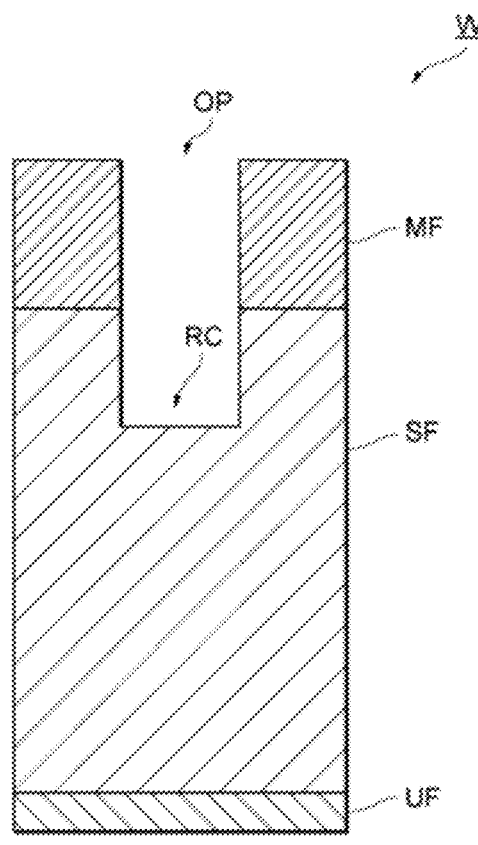
FIG. 9B is a diagram of the substrate W showing an example cross-sectional structure at the end of a period L1.

FIG. 9A is a diagram of the substrate W showing an example cross-sectional structure at the end of the period $H_1$ (step ST21 of the first cycle) (time t21) in FIG. 7 or FIG. 8. FIG. 9B is a diagram of the substrate W showing an example cross-sectional structure at the end of the period L1 (step ST22 of the first cycle) (time t22) in FIG. 7 or FIG. 8.

As shown in FIG. 9A, in the processing in the period $H_1$ (step ST21 of the first cycle), the portion of the silicon-containing film SF exposed through the opening OP is etched in the depth direction (from the top to the bottom in FIG. 9A) to form a recess RC. In the period $H_1$, the silicon-containing film SF is etched until the recess RC reaches a predetermined depth (e.g., 1/n of the thickness of the silicon-containing film SF when n cycles of step ST21 and step ST22 are repeated). In the period $H_1$, as in the period H described above, the silicon-containing film SF is etched at a higher etching rate than in the period L1. This causes the recess RC to be tapered in the depth direction (refer to FIG. 9A).

In the subsequent period L1 (step ST22 of the first cycle), as in the period L described above, the silicon-containing film SF is etched at a lower etching rate than in the period $H_1$, while the etching proceeds in the horizontal direction, causing the recess RC that is tapered to be close to a rectangular shape (refer to FIG. 9B). More specifically, the recess RC has higher verticality.

In the example shown in FIG. 7 or FIG. 8, step ST1 (the period $H_1$, period $H_2$, or other periods) to etch the silicon-containing film SF at a high etching rate and step ST2 (the period L1 and period L2) to widen the bottom of the recess RC in the silicon-containing film SF are repeated alternately. This prevents the etching rate from decreasing in step ST2 and increases the verticality of the recess and reduces feature failures in etching.

Modifications

The embodiments of the present disclosure may be modified in various ways without departing from the spirit and scope of the present disclosure. For example, the embodiment may be modified in the forms described below.

Figure 10:
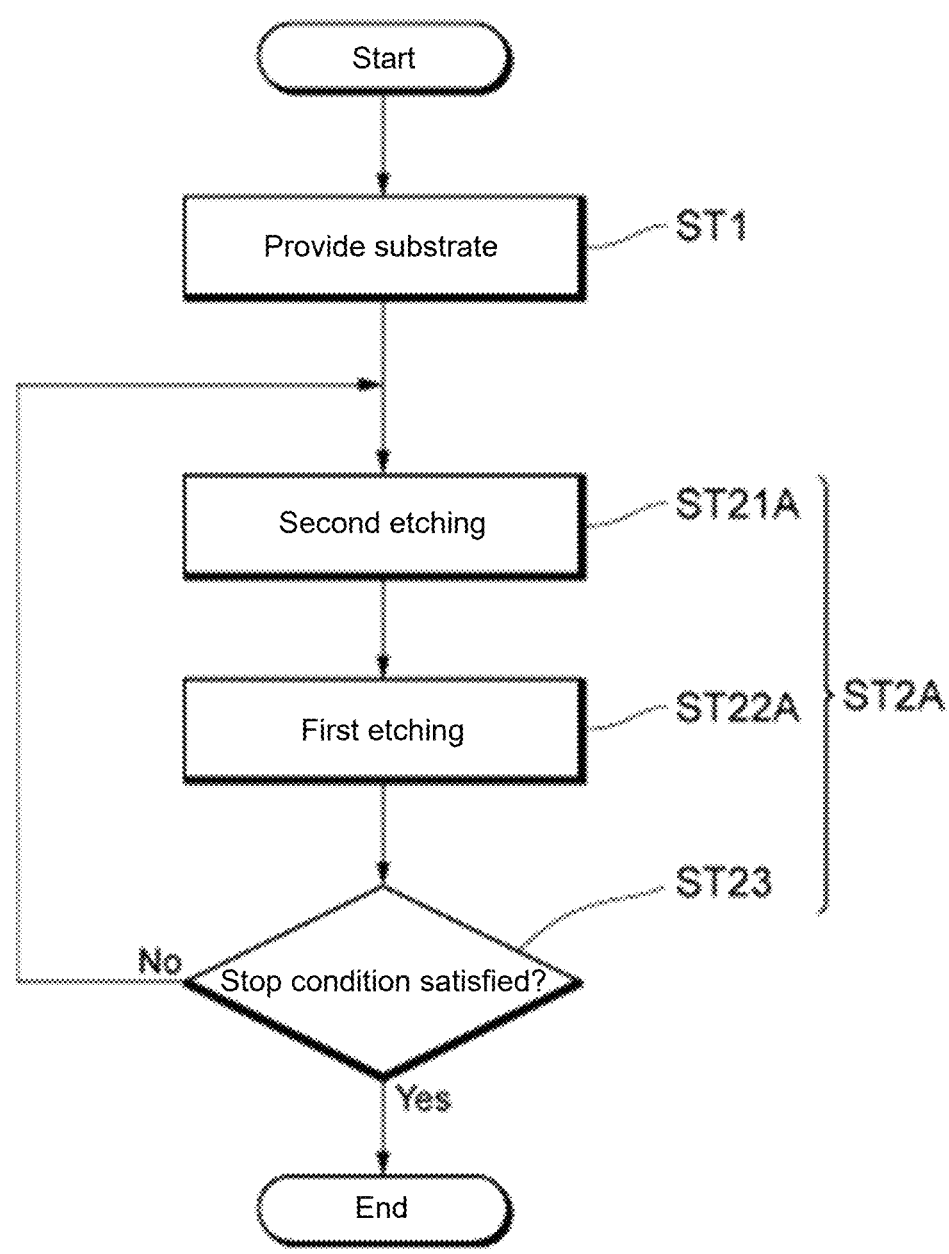
FIG. 10 is a flowchart of the processing method according to a modification.

FIG. 10 is a flowchart of the processing method according to another embodiment. As shown in FIG. 10, the first etching and the second etching may be performed in the opposite order in the etching process. More specifically, the silicon-containing film SF may be first etched using the second process gas (step ST21A), and then may be etched using the first process gas (step ST23A). In step ST2A, the determination as to whether the stop condition is satisfied may be performed between step ST21A and step ST22A, in addition to being performed in step ST23.

Figure 11:
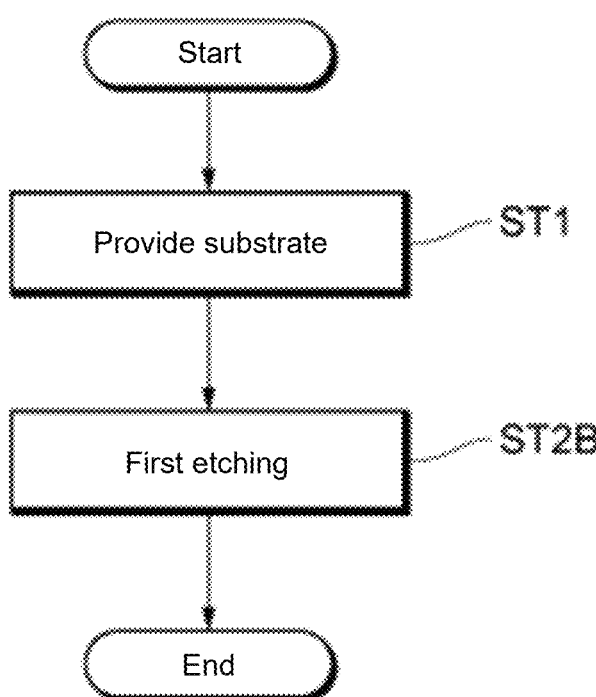
FIG. 11 is a flowchart of the processing method according to another modification.

FIG. 11 is a flowchart of the processing method according to another modification. As shown in FIG. 11, the etching process may include the first etching alone. More specifically, the etching in step ST2B may include etching the silicon-containing film SF using the first process gas (step ST2B).

As the etching proceeds, more heat enters the substrate W from the plasma, thus increasing the temperature of the substrate W. Hydrogen fluoride tends to adsorb more easily to the silicon-containing film SF in the substrate W at a lower temperature. As the etching proceeds, less hydrogen fluoride may adsorb to the silicon-containing film SF and the etching rate may decrease. Thus, for example, a reaction accelerator gas may be supplied in the middle toward the end of the etching process when the etching rate may decrease. This prevents the etching rate from decreasing. The amount of reaction accelerator gas to be supplied may be set based on, for example, the etching time, and the temperature of the substrate W and the substrate support 11.

As the aspect ratio of the recess formed by etching increases, the amount of etchant (an active species of hydrogen fluoride) supplied to the bottom of the recess decreases. The partial pressure of the reaction control gas may be changed in accordance with the aspect ratio of the recess. For example, the partial pressure of the reaction accelerator gas may be higher for etching of an area with a higher aspect ratio than for etching of an area with a lower aspect ratio. This can accelerate the reaction between the etchant and the silicon-containing film SF in the area with a higher aspect ratio.

The deposition of reaction byproducts resulting from etching of the silicon-containing film SF can decrease the etching rate. A reaction inhibitor gas may be temporarily supplied during the etching to cause the reaction byproducts to volatize. The reaction accelerator gas may be supplied at preset timing or may be supplied as appropriate for the state of etching determined based on, for example, the discharge state of the plasma. Any amount of reaction inhibitor gas may be supplied for any duration to accelerate volatilization of the reaction byproducts.

The processing method may be performed with, in addition to the plasma processing apparatus 1 using capacitively coupled plasma, a plasma processing apparatus using any plasma source for, for example, inductively coupled plasma or microwave plasma.

EXAMPLES

Examples of the processing method will now be described. The present disclosure is not limited to the examples described below.

Example 1 and Example 2

The plasma processing apparatus 1 was used with the processing method to etch a substrate with the same structure as the substrate W shown in FIG. 3. An amorphous carbon film with an opening OP being a hole was used as the mask MF. A silicon oxide film was used as the silicon-containing film SF. The first process gas contains a $Cl_2$ gas as a reaction inhibitor gas, in addition to an HF gas. The second process gas contains a $Cl_2$ gas as a reaction inhibitor gas, in addition to an HF gas. The reaction inhibitor gas ($Cl_2$ gas) contained in the second process gas had a lower partial pressure than the reaction inhibitor gas ($Cl_2$ gas) contained in the first process gas. The temperature of the substrate support 11 was set at 15° C. In Example 1, one cycle of step ST21 (620 seconds) and step ST22 (310 seconds) in FIG. 2 was performed. In Example 2, four cycles of step ST21 (150 seconds) and step ST22 (50 seconds) in FIG. 2 were performed in this order.

Comparative Example 1

In Comparative Example 1, a substrate W with the same structure as in Example 1 and Example 2 was etched using the plasma processing apparatus 1. In Comparative Example 1, the etching was performed continuously for 840 seconds using a process gas that is the same as the first process gas used in Example 1 and Example 2. The temperature of the substrate support 11 was set at 15° C.

Table 1 shows the etching rate ER (nm/min) and the BB bias (nm) of the silicon-containing film SF in each of Example 1, Example 2, and Comparative Example 1. The BB bias is a difference between the maximum opening width of the recess formed by etching and the opening width of the recess at the bottom. The BB bias being a smaller value indicates the recess being closer to a rectangular shape (with higher verticality).

TABLE 1

|  | Example 1 | Example 2 | Comparative Example 1 |
|---|---|---|---|
| ER | 415 | 453 | 425 |
| BB bias | 63 | 63 | 71 |

Although the etching rate was slightly lower in Example 1 than in Comparative Example 1, the BB bias was smaller and the verticality of the recess was higher in Example 1. The etching rate was higher in Example 2 than in Comparative Example 1. The BB bias was smaller and the verticality of the recess was higher in Example 2 than in Comparative Example 1. In both Example 1 and Example 2, the etching rate was prevented from decreasing, and the verticality of the recess was higher (feature failures were reduced).

Example 3 and Example 4

The plasma processing apparatus 1 was used with the processing method to etch a substrate with the same structure as the substrate W shown in FIG. 3. An amorphous carbon film with an opening OP being a hole was used as the mask MF. A silicon oxide film was used as the silicon-containing film SF. The first process gas contains $PF_3$ gas as a reaction accelerator gas, in addition to an HF gas. The second process gas contains an HF gas and no a $PF_3$ gas. The temperature of the substrate support 11 was set at −20° C. Four cycles of step ST21A (40 seconds) and step ST22A (120 seconds) in FIG. 10 were performed. In Example 3, a pulsed wave of a source RF signal with the same duty ratio (37%) was used in both step ST21A and step ST22A to generate plasma. In Example 4, a pulsed wave of a source RF signal with a duty ratio of 29% was used in step ST21A to generate plasma, and a pulsed wave of a source RF signal with a duty ratio of 37% was used in step ST22A to generate plasma.

Table 2 shows the etching rate ER (nm/min) and the BB bias (nm) of the silicon-containing film SF in each of Example 3 and Example 4.

TABLE 2

|  | Example 3 | Example 4 |
|---|---|---|
| ER | 469 | 472 |
| BB bias | 77 | 80 |

The etching rate was slightly higher and the BB bias was slightly larger in Example 4 than in Example 3. In Example 4, the duty ratio was set lower in step ST21A than in step ST22B. This seemingly caused less heat to enter the substrate W and prevented the etching rate from decreasing.

The embodiments of the present disclosure further include the aspects described below.

Appendix 1

A device manufacturing method implementable with a plasma processing apparatus including a chamber, the method comprising:

(a) placing a substrate on a substrate support located in the chamber, the substrate including a silicon-containing film and a mask on the silicon-containing film; and (b) etching the silicon-containing film, (b) including (b-1) etching the silicon-containing film using plasma generated from a first process gas, the first process gas containing a hydrogen fluoride gas and a reaction control gas to control a reaction between hydrogen fluoride and the silicon-containing film, the first process gas containing, as the reaction control gas, at least one of a reaction accelerator gas to accelerate the reaction or a reaction inhibitor gas to inhibit the reaction, and (b-2) etching the silicon-containing film using plasma generated from a second process gas, the second process gas containing a hydrogen fluoride gas, the second process gas containing at least one of a reaction accelerator gas to accelerate the reaction or a reaction inhibitor gas to inhibit the reaction, or containing no reaction control gas, the reaction accelerator gas contained in the second process gas having a lower partial pressure than the reaction accelerator gas contained in the first process gas, the reaction inhibitor gas contained in the second process gas having a higher partial pressure than the reaction inhibitor gas contained in the first process gas.

Appendix 2

A program executable by a computer in a plasma processing system, the plasma processing system including a chamber, a substrate support located in the chamber, and a plasma generator, the program causing the computer to control operations comprising:

(a) placing a substrate on the substrate support located in the chamber, the substrate including a silicon-containing film and a mask on the silicon-containing film, and (b) etching the silicon-containing film, (b) including (b-1) etching the silicon-containing film using plasma generated from a first process gas, the first process gas containing a hydrogen fluoride gas and a reaction control gas to control a reaction between hydrogen fluoride and the silicon-containing film, the first process gas containing, as the reaction control gas, at least one of a reaction accelerator gas to accelerate the reaction or a reaction inhibitor gas to inhibit the reaction, and (b-2) etching the silicon-containing film using plasma generated from a second process gas, the second process gas containing a hydrogen fluoride gas, the second process gas containing at least one of a reaction accelerator gas to accelerate the reaction or a reaction inhibitor gas to inhibit the reaction, or containing no reaction control gas, the reaction accelerator gas contained in the second process gas having a lower partial pressure than the reaction accelerator gas contained in the first process gas, the reaction inhibitor gas contained in the second process gas having a higher partial pressure than the reaction inhibitor gas contained in the first process gas.

Appendix 3

A storage medium storing the program according to appendix 2.

REFERENCE SIGNS LIST

1 Plasma processing apparatus
2 Controller
10 Plasma processing chamber
10s Plasma processing space
11 Substrate support
13 Shower head
20 Gas supply unit
31a First RF generator
31b Second RF generator
32a First DC generator
SF Silicon-containing film
MF Mask OP Opening
RC Recess
UF Underlying film
W Substrate

The invention claimed is:

1. An etching method, comprising:
(a) providing a substrate in a chamber, the substrate including a silicon-containing film and a mask on the silicon-containing film; and
(b) etching the silicon-containing film, including
(b-1) etching the silicon-containing film using plasma generated from a first process gas, the first process gas containing a hydrogen fluoride gas and a reaction control gas to control a reaction between hydrogen fluoride and the silicon-containing film, the first process gas containing, as the reaction control gas, at least one of a reaction accelerator gas to accelerate the reaction or a reaction inhibitor gas to inhibit the reaction, and
(b-2) etching the silicon-containing film using plasma generated from a second process gas, the second process gas containing a hydrogen fluoride gas, the second process gas containing at least one of a reaction accelerator gas to accelerate the reaction or a reaction inhibitor gas to inhibit the reaction, or containing no reaction control gas, the reaction accelerator gas contained in the second process gas having a lower partial pressure than the reaction accelerator gas contained in the first process gas, the reaction inhibitor gas contained in the second process gas having a higher partial pressure than the reaction inhibitor gas contained in the first process gas, wherein
(b) includes alternately repeating (b-1) and (b-2).

2. The etching method according to claim 1, wherein the alternately repeating in (b) includes switching between (b-1) and (b-2) based on at least one of a depth of a recess to be formed in the silicon-containing film by etching, an aspect ratio of the recess, or an etching time of the etching.

3. The etching method according to claim 1, wherein
(b-1) includes generating the plasma from the first process gas using a pulsed wave of a source radio-frequency signal having a first duty ratio, and
(b-2) includes generating the plasma from the second process gas using a pulsed wave of a source radio-frequency signal having a second duty ratio lower than the first duty ratio.

4. The etching method according to claim 1, wherein the reaction accelerator gas is at least one selected from the group consisting of a phosphorus-containing gas, a nitrogen-containing gas, and a hydrogen-containing gas.

5. The etching method according to claim 4, wherein the phosphorous-containing gas is a phosphorus halide gas.

6. The etching method according to claim 4, wherein the nitrogen-containing gas is at least one selected from the group consisting of an $NH_3$ gas, an $NF_3$ gas, an NO gas, and an $NO_2$ gas.

7. The etching method according to claim 4, wherein the hydrogen-containing gas is a gas having a hydroxyl group.

8. The etching method according to claim 1, wherein the reaction inhibitor gas is a chlorine-containing gas.

9. The etching method according to claim 8, wherein the chlorine-containing gas is at least one selected from the group consisting of a $Cl_2$ gas, an $SiCl_2$ gas, an $SiH_2Cl_2$ gas, an $SiCl_4$ gas, an $Si_2Cl_6$ gas, a $CHCl_3$ gas, a $CCl_4$ gas, and a $BCl_3$ gas.

10. The etching method according to claim 1, wherein each of the first process gas and the second process gas contains the hydrogen fluoride gas with a highest partial pressure of non-inert components of each of the first process gas and the second process gas.

11. The etching method according to claim 1, wherein at least one of the first process gas or the second process gas further includes at least one selected from the group consisting of a carbon-containing gas, an oxygen-containing gas, a carbon-free fluorine-containing gas, and a halogen-containing gas other than fluorine.

12. The etching method according to claim 1, wherein the reaction inhibitor gas contained in the first process gas and the reaction inhibitor gas contained in the second process gas are of the same gas type.

13. The etching method according to claim 1, wherein the reaction accelerator gas contained in the first process gas and the reaction accelerator gas contained in the second process gas are of the same gas type.

14. An etching method, comprising:

(a) providing a substrate in a chamber, the substrate including a silicon-containing film and a mask on the silicon-containing film; and (b) etching the silicon-containing film, including (b-1) etching the silicon-containing film using plasma containing an active species of hydrogen fluoride generated from a first process gas, the first process gas containing, as a reaction control gas to control a reaction between hydrogen fluoride and the silicon-containing film, at least one of a reaction accelerator gas to accelerate the reaction or a reaction inhibitor gas to inhibit the reaction, and (b-2) etching the silicon-containing film using plasma containing an active species of hydrogen fluoride generated from a second process gas, the second process gas containing at least one of a reaction accelerator gas to accelerate the reaction or a reaction inhibitor gas to inhibit the reaction, or containing no reaction control gas, the reaction accelerator gas contained in the second process gas having a lower partial pressure than the reaction accelerator gas contained in the first process gas, the reaction inhibitor gas contained in the second process gas having a higher partial pressure than the reaction inhibitor gas contained in the first process gas, wherein (b) includes alternately repeating (b-1) and (b-2).

15. The etching method according to claim 14, wherein the active species of hydrogen fluoride is generated from at least one gas selected from the group consisting of a hydrogen fluoride gas and a hydrofluorocarbon gas.

16. The etching method according to claim 14, wherein the active species of hydrogen fluoride is generated from a fluoride-containing gas and a hydrogen-containing gas.

17. An etching method, comprising:

(a) providing a substrate in a chamber, the substrate including a silicon-containing film and a mask on the silicon-containing film; and (b) etching the silicon-containing film, including (b-1) etching the silicon-containing film u sing plasma generated from a first process gas, the first process gas containing a hydrogen fluoride gas and a reaction control gas to control a reaction between hydrogen fluoride and the silicon-containing film, the first process gas containing, as the reaction control gas, at least one of a reaction accelerator gas to accelerate the reaction or a reaction inhibitor gas to inhibit the reaction, and (b-2) etching the silicon-containing film using plasma generated from a second process gas, the second process gas containing a hydrogen fluoride gas, the second process gas containing at least one of a reaction accelerator gas to accelerate the reaction or a reaction inhibitor gas to inhibit the reaction, or containing no reaction control gas, the reaction accelerator gas contained in the second process gas having a lower partial pressure than the reaction accelerator gas contained in the first process gas, the reaction inhibitor gas contained in the second process gas having a higher partial pressure than the reaction inhibitor gas contained in the first process gas, wherein in (b), (b-1) is performed after (b-2).

18. The etching method according to claim 17, wherein (b-1) includes generating the plasma from the first process gas using a pulsed wave of a source radio-frequency signal having a first duty ratio, and (b-2) includes generating the plasma from the second process gas using a pulsed wave of a source radio-frequency signal having a second duty ratio lower than the first duty ratio.

19. The etching method according to claim 17, wherein the reaction accelerator gas is at least one selected from the group consisting of a phosphorus-containing gas, a nitrogen-containing gas, and a hydrogen-containing gas.

20. The etching method according to claim 19, wherein the phosphorous-containing gas is a phosphorus halide gas.

* * * * *